(12) United States Patent
Kong et al.

(10) Patent No.: US 8,143,164 B2
(45) Date of Patent: Mar. 27, 2012

(54) FORMATION OF A ZINC PASSIVATION LAYER ON TITANIUM OR TITANIUM ALLOYS USED IN SEMICONDUCTOR PROCESSING

(75) Inventors: Bob Kong, Newark, CA (US); Zhi-Wen Sun, San Jose, CA (US); Chi-I Lang, Sunnyvale, CA (US); Jinhong Tong, San Jose, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 527 days.

(21) Appl. No.: 12/368,110

(22) Filed: Feb. 9, 2009

(65) Prior Publication Data

US 2010/0203731 A1    Aug. 12, 2010

(51) Int. Cl.
*H01L 21/302*  (2006.01)
*H01L 21/461*  (2006.01)

(52) U.S. Cl. ........ 438/689; 438/678; 438/694; 438/745; 438/613; 428/620; 510/175

(58) Field of Classification Search .......... 438/678, 438/758, 620
See application file for complete search history.

(56) References Cited

U.S. PATENT DOCUMENTS 6,165,912 A * 12/2000 McConnell et al. .......... 438/758
6,319,387 B1 * 11/2001 Krishnamoorthy et al. .. 205/240

FOREIGN PATENT DOCUMENTS

WO  WO2007044446  * 4/2007

OTHER PUBLICATIONS

Chen et al. A zinc transition layer in electroless nickel plating, Surface & Coating Technology 201 (2006) pp. 686-690.*

* cited by examiner

*Primary Examiner* — Duy Deo
*Assistant Examiner* — Erin Flanagan

(57) ABSTRACT

Embodiments of the current invention describe methods of processing a semiconductor substrate that include applying a zincating solution to the semiconductor substrate to form a zinc passivation layer on the titanium-containing layer, the zincating solution comprising a zinc salt, $FeCl_3$, and a pH adjuster.

4 Claims, 3 Drawing Sheets

FORMATION OF A ZINC PASSIVATION LAYER ON TITANIUM OR TITANIUM ALLOYS USED IN SEMICONDUCTOR PROCESSING

FIELD OF THE INVENTION

The present invention relates generally to semiconductor processing. More specifically, a method of forming a zinc passivation layer on titanium or titanium alloys used in semiconductor processing as well as the zincating solution used in this method is described.

BACKGROUND OF THE INVENTION

Titanium and its alloys are highly reactive with oxygen and will rapidly form an oxidized layer on exposed surfaces when exposed to air or moisture of any kind. This means that titanium and its alloys will reoxidize very quickly even after the removal of an oxidized layer. This makes the formation of coatings or layers of other types of materials directly onto titanium or titanium alloys difficult and layers formed on an oxidized titanium layer may not be uniform because of lack of adhesion.

The formation of a platinum (Pt) passivating film on titanium nitride (TiN) is of value to the memory applications. Because of the rapid oxidation of TiN after removal of the native oxide a vacuum deposition of Pt onto TiN has been attempted using physical vapor deposition techniques. The use of a vacuum atmosphere solves the problem of reoxidation of the TiN in air but PVD is a nonselective deposition, requiring the subsequent removal of platinum from regions other than the TiN and therefore increasing the number of processing steps. Wet processes to deposit platinum on TiN are inherently difficult to use because TiN bared of its oxide will rapidly oxidize when exposed to water or air in such a non-vacuum environment. The oxide layer may be removed before the application of the wet processes such as electrodeposition or electroless deposition. The oxidized layer is typically removed using an acidic formulation that includes hydrofluoric acid (HF). This is detrimental to most substrates because HF is a strong etchant and will attack materials other than the oxide layer. In particular, in memory applications, HF will attack materials such as silicon, silicon dioxide, and tungsten. Therefore HF chemistries make the use of subsequent wet processes difficult. Also, similar to PVD, electrochemical deposition of Pt is nonselective to TiN.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the current invention describe methods of forming a zinc passivating layer using a wet process on the surface of a titanium or a titanium-containing layer of a semiconductor substrate. The zinc passivating layer may allow for subsequent aqueous processing to deposit a film on the titanium or titanium alloy. In one embodiment the aqueous processing may be an electroless deposition process. In one particular embodiment, a substrate having a titanium nitride surface is processed to selectively form a zinc passivating layer on the titanium nitride portions of the substrate and to subsequently form a platinum layer selectively on the titanium nitride portions using an electroless plating process.

Figure 1:
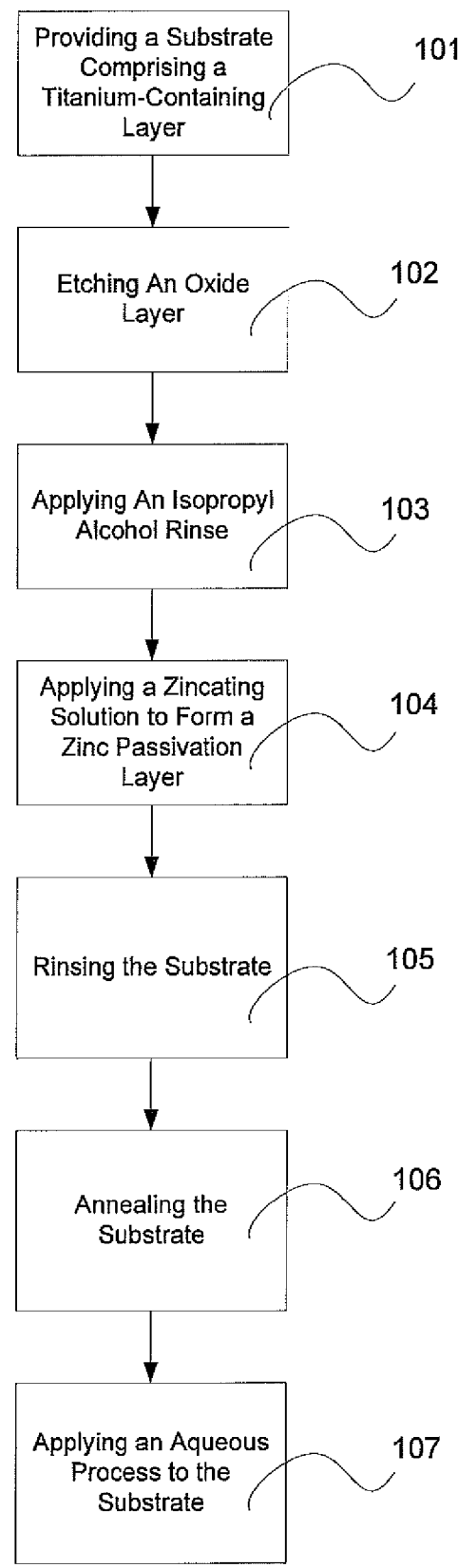
FIG. 1 is a flowchart describing a zincating process according to various embodiments.
Figure 2A:
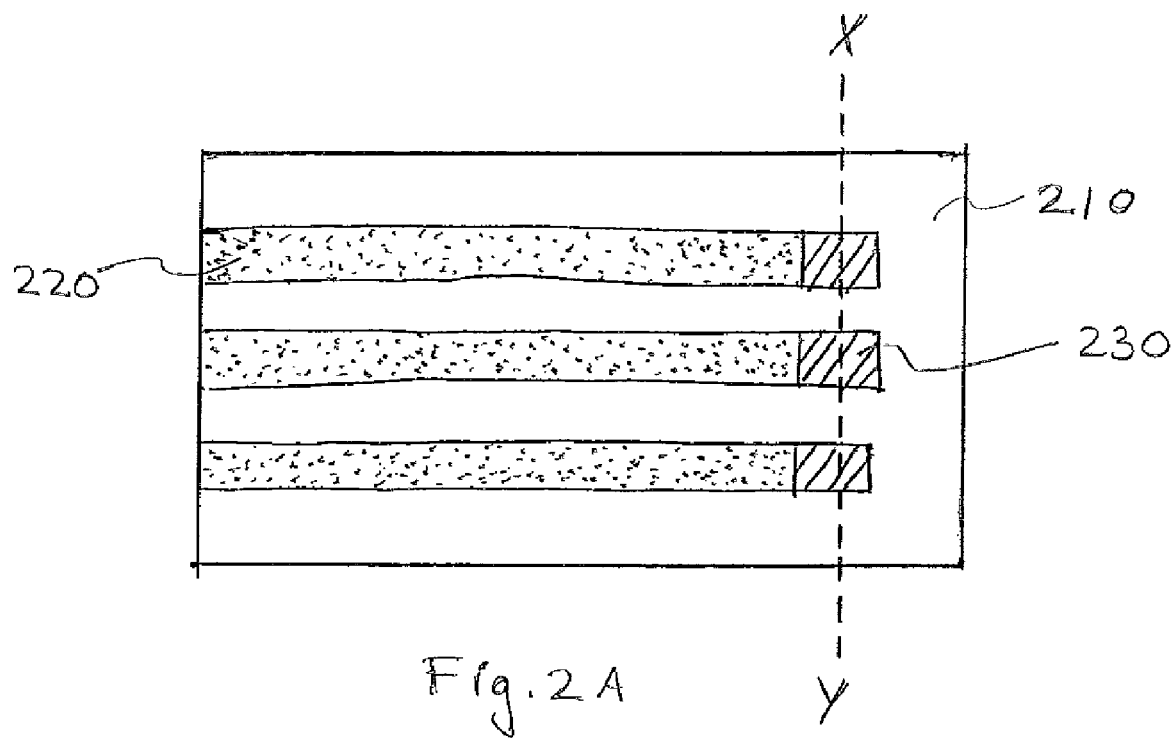
FIGS. 2A-2F illustrate cross-sections of a substrate at different points in the zincating process according to various embodiments.
Figure 2B:
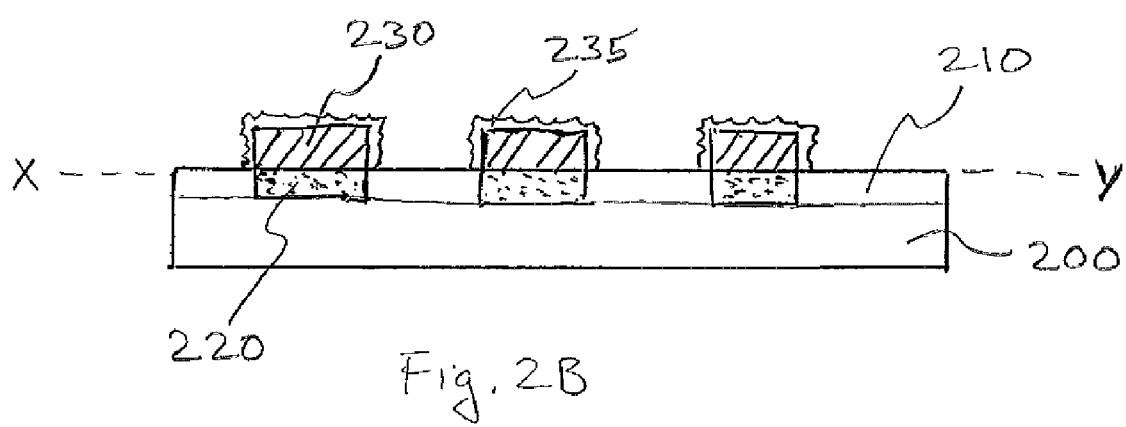

At block 101 of the flowchart illustrated in FIG. 1, a semiconductor substrate is provided that has a titanium or a titanium-containing layer. The titanium-containing layer may be a titanium alloy such as titanium nitride or titanium aluminum nitride. The titanium alloy may be a combination of titanium and one or more of the following elements: nickel, aluminum, ruthenium, silicon, vanadium, palladium, molybdenum, zirconium, chromium, or niobium. In one particular application, for example, titanium nitride is used for memory applications in the semiconductor industry where titanium nitride is valued for its work function. In this application, as illustrated in FIG. 2B, the substrate provided may be a semiconductor substrate 200 such as silicon. The semiconductor substrate 200 may also include materials such as silicon dioxide as an insulator 210 and tungsten as a bottom electrode material 220 over which the titanium-containing material 230 may be formed. FIG. 2B is a cross-sectional view of FIG. 2A, cutting through FIG. 2A from X to Y. FIG. 2A illustrates, for purposes of example to describe an embodiment of the current invention, a top-down view of a semiconductor substrate used as a test chip having multiple tungsten lines 220 and over which regions of the titanium nitride 230 have been formed. FIG. 2B illustrates the titanium nitride regions 230 after an oxide layer 235 has formed.

Figure 2C:
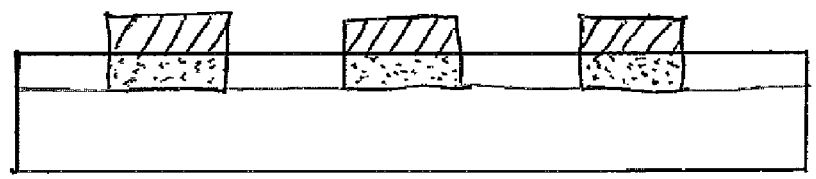

At block 102 an oxide layer, such as oxide layer 235 illustrated in FIG. 2B, is removed from the titanium-containing layer 230 to leave an oxide free surface as illustrated in FIG. 2C. Titanium and titanium alloys easily form an oxide layer on any exposed surfaces when exposed to oxygen. As such, any exposure to the air or moisture will form the oxide layer. The oxide layer may interfere with the adhesion and uniformity of materials deposited on the titanium-containing layer. Therefore it is beneficial to remove the oxide layer before the deposition of any material on the titanium-containing layer. The oxide layer may be removed with either an acidic or an alkaline chemical solution. The acidic solution may include a mixture of acids and in an embodiment uses oxalic acid ($H_2C_2O_4$) as the main acid mixed with other acids such as sulfuric acid ($H_2SO_4$), hydrochloric acid (HCl), and phosphoric acid ($H_3PO_4$). The acid etching solution does not include hydrofluoric acid (HF) because HF is too harsh for application to the types of materials used in semiconductor processing and memory applications, such as silicon, silicon dioxide and tungsten. In one particular embodiment the acid solution used to etch the oxide layer from the titanium-containing layer is a mixture of oxalic acid, hydrochloric acid, and phosphoric acid. The oxalic acid is the main etching acid, the hydrochloric acid serves as an etching accelerator, and the phosphoric acid is used to enhance uniform TiN surface etch serves where the concentration range of oxalic acid is in the approximate range of 10 g/L and 100 g/L of oxalic acid-dihydrate, hydrochloric acid in the approximate range of 100 ml/L to 500 ml/L of 37 weight % HCl in water, and phosphoric acid in the approximate range of 50 ml/L and 300 ml/L of 85 weight % phosphoric acid in water. This acid etching solution may have a temperature in the range of 40° C. to 95° C. during the etching process and may be applied to the substrate for a time period in the range of 30 seconds to 60 minutes. In one particular embodiment this etching solution has a temperature of approximately 80° C. and is applied to the substrate for a time in the approximate range of 1 minute to 3 minutes. The etching solution may be in the form of a bath and the substrate immersed in the bath. Alternatively the solution may be dispensed or sprayed onto the surface of the substrate.

In an alternate embodiment the etching solution may be an alkaline solution including tetramethylammonium hydroxide (TMAH), a chelating agent, and an oxidizer. This alkaline solution dissolves the surface oxide layer into soluble $HTiO_3^-$ ions in the aqueous solution. The pH of the solution is determined by the TMAH addition and may be in the range of pH 12-14, and the alkaline solution may be within the temperature range of 20° C.-90° C. The addition of chelating agents such as ethylenediaminetetracetic acid (EDTA), ethylenediamine (ED), citric acid, tartaric acid may help induce uniform surface etching. The concentration of the chelating agent can vary within the approximate range of 0.5 millimoles per liter to 10 millimoles per liter. The addition of oxidizers such as hydrogen peroxide ($H_2O_2$), iron tri-chloride ($FeCl_3$), ammonium persulfate (($NH_4)_2S_2O_8$), or perchloric acid ($HClO_4$) may ensure the formulation of soluble $HTiO_3-$ ions. The oxidizer concentration can be within the approximate range of 10 millimoles per liter to 1 mole per liter.

After removing the oxide layer, the surface of the titanium or titanium alloy is rinsed with an alcohol rinse at block 103 of the flowchart in FIG. 1. The alcohol rinse removes any of the etching solution from the surface of the substrate and also aids in maintaining the oxide-free surface. Alcohols that may be used as the rinse include methanol, ethanol, and isopropyl alcohol (IPA) or any mixture of these alcohols. In one particular embodiment, the rinse may be isopropyl alcohol (IPA). The IPA may be applied to the substrate at approximately room temperature and for a time in the approximate range of 2 minutes or less and more particularly for less than 30 seconds. The IPA rinse should be applied to the substrate immediately after removal of the oxide to prevent any re-oxidation of the titanium or titanium alloy. The IPA rinse may be applied to the substrate within approximately 15 seconds after the application of the oxide etching solution to the substrate. In an embodiment, the IPA rinse may be applied to the substrate while the oxide etching solution is still on the surface of the substrate so that the non-oxidized titanium or titanium alloy is not exposed to any air or moisture that could cause re-oxidation.

Figure 2D:
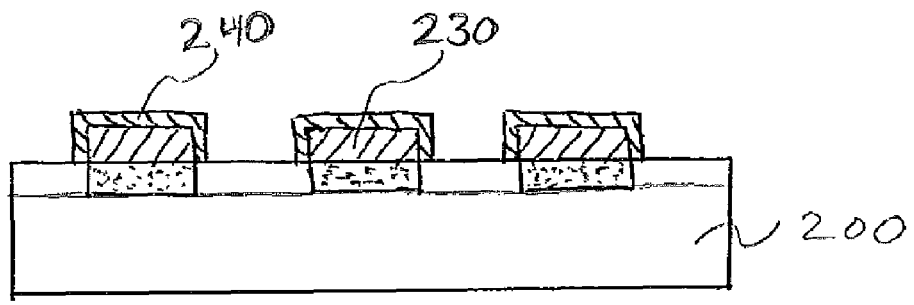

The zincating formulation is then applied to the semiconductor substrate having a titanium-containing layer to form a zinc passivation layer on the titanium-containing layer at block 104 of the flowchart of FIG. 1. FIG. 2D illustrates the formation of a zinc passivation layer 240 on the surface of the titanium containing layer 230. The zincating formulation is formed of a zinc salt, iron chloride ($FeCl_3$), and an acid. The zinc salt may be zinc sulfate ($ZnSO_4$) which may be in the form of $ZnSO_4.5H_2O$. Other zinc salts may also be used such as zinc chloride, ($ZnCl_2$) and zinc nitrate ($Zn(NO_3)_2$). The zinc salt provides the zinc needed to form the zinc layer on the titanium-containing layer of the substrate in the zincating process. The amount of the zinc salt in the formulation has a concentration in the approximate range of 4 g/L to 200 g/L and more particularly in the approximate range of 10 g/L to 40 g/L. The iron chloride ($FeCl_3$) serves to activate the titanium-containing surface for the deposition of the zinc layer during the zincating process. The amount of iron chloride in the zincating formulation may be in the approximate range of 6 mM to 18 mM. The acid is added to the zincating formulation to adjust the pH of the solution to be in the approximate range of 1.9 and 2.4, and more particularly in the approximate range of 2.2 and 2.3. Acids that may be used include hydrochloric acid (HCl), $H_2SO_4$, aminosulfonic acid, citric acid, tartaric acid, sulfamic acid, and oxalic acid, or any mixture of these acids. In one particular embodiment, the acid is a mixture of sulfamic acid and oxalic acid. The amount of acid added depends on the amount needed to adjust the pH to be within the ideal range. This may be an amount of acid in the approximate range of 10 mM to 50 mM. The addition of the acid also prevents the zincating solution from hydrolysis. If the pH is too high, the zinc may turn into zinc hydride and precipitate out of the solution. The pH range of 1.9 to 2.4 maintains the zinc ions in solution so that zincating may occur. The zincating formulation is formulated such that the acid used as the pH adjuster does not need to be a strong acid, such as hydrofluoric acid, that may etch the substrate.

The zincating formulation may also include a surfactant to increase wettability of the solution on the surface of the substrate. The surfactant may be anionic, cationic, or non-ionic. In one particular embodiment, the surfactant may be a cationic compound such as cetyltrimethylammonium bromide (CTAB). The amount of surfactant added to the solution may be in the approximate range of 10 ppm to 200 ppm. The zincating formulation may be applied to the substrate by immersion of the substrate in a bath of the zincating solution. Alternate methods of application include spraying or dispensing the zincating solution onto the substrate. In an embodiment, the zincating formulation may be applied to the substrate while also applying ultrasonic or megasonic energy to the substrate. One way to do this is by immersing the substrate in a bath of the zincating formulation and applying the sonic energy to the bath. In this embodiment, the ultrasonic energy may have a frequency in the approximate range of 20 kHz to 40 kHz. The ultrasonic enhanced zincating may improve the uniformity of the zinc layer formed on the titanium-containing layer. The use of ultrasonic energy in combination with the application of the zincating formulation may be performed for a time in the approximate range of 20 seconds to 5 minutes, and more particularly for approximately 1 minute. The application of the zincating formulation to the substrate will form a very thin zinc passivation layer that may have a thickness in the approximate range of 0.3 nm and 10.0 nm and more particularly in the approximate range of 2.0 nm to 5.0 nm.

In an embodiment, a double zincating process may be performed. Blocks 102, 103 and 104 of the process may be repeated to enhance the zincating process. Block 102 is the oxide etching of the substrate surface to remove the oxide from the titanium-containing layer. The second etching may remove any titanium oxide that formed after the initial oxide removal or any oxide that remained after the initial oxide removal. The IPA rinse of block 103 may then be applied to the substrate to prevent the growth of any new oxide on the titanium-containing layer. The zincating formulation of block 104 may then be applied again to the substrate to form the zinc passivation layer over the titanium-containing layer. It is theorized that by repeating blocks 102, 103, and 104 of the zincating process that it may be possible to form a more uniform and oxide-free zinc passivation layer on the surface of the titanium-containing layer. The double zincating process may also increase the density of the zinc layer and thus improve the coverage of the zinc layer on the titanium-containing layer. Greater control of the thickness of the zincating layer may also be possible using this process, which may also allow for the avoidance of overplating of zinc. The second zincating process may apply the oxide etching solution and the zincating formulation to the substrate for a shorter time period than in the first application. The repetition of the zincating process is not limited to a double zincating process but may be repeated any number of times to achieve a multiple zincating process.

At block 105 of the flowchart of FIG. 1, the substrate is rinsed with a water rinse to remove any excess zincating solution after the formation of the zinc passivation layer. The water rinse may be deionized water at room temperature and may be applied for the time needed to remove the zincating solution from the substrate.

The substrate may be annealed at block 106 of FIG. 1. The thermal treatment in the form of annealing may be performed at a temperature in the approximate range of 250° C. and 300° C. for 30 minutes to 1 hour. The annealing may improve the uniformity and density of the zinc passivation layer formed on the titanium-containing layer.

Figure 2E:
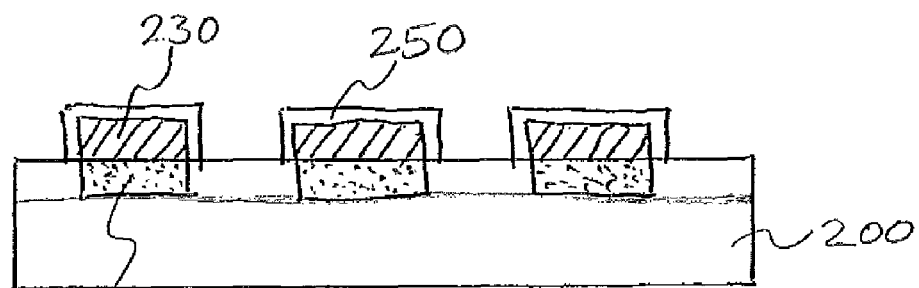
Figure 2F:
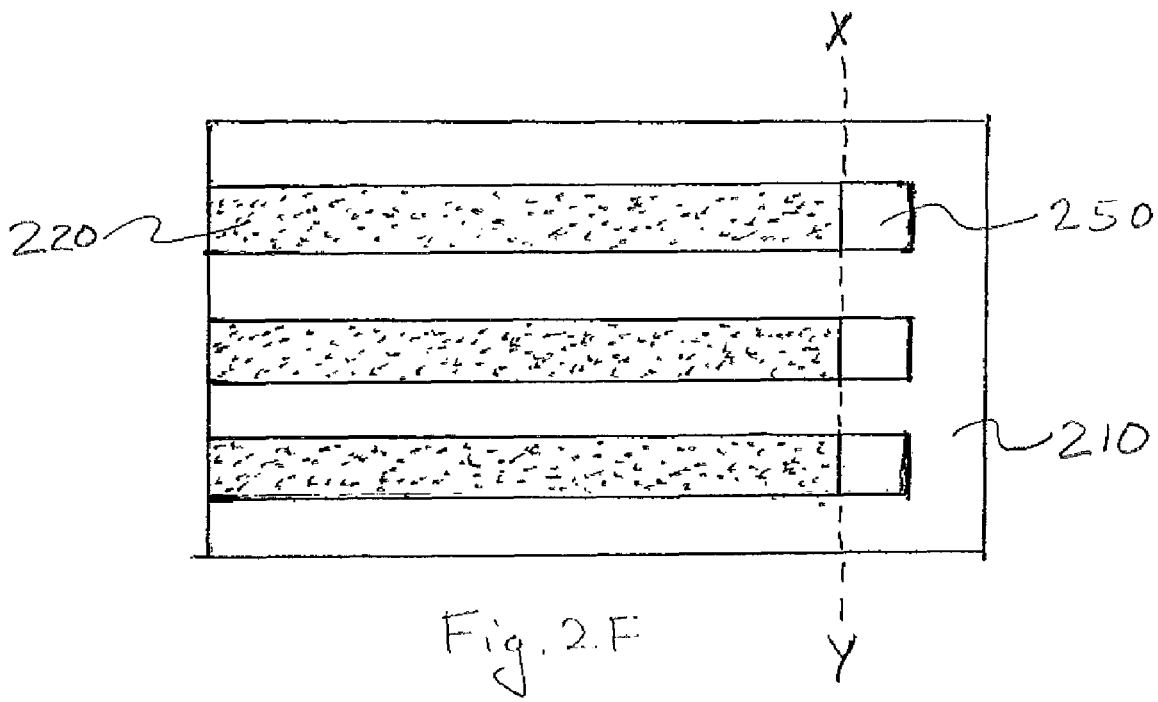

At block 107 of the flowchart of FIG. 1, an aqueous process is applied to the substrate. Examples of aqueous processes that may be used include electroless deposition, electroplating, or a displacement process. The zincating process forms a zinc passivation layer on a titanium-containing layer that protects the titanium-containing layer from oxidation before and during the aqueous process. The aqueous process may be used to deposit a metal over the titanium-containing material. In the instance where the aqueous process is an electroless process the zinc layer may act as an activation layer and may therefore be consumed in the process resulting in the formation of the newly deposited layer directly on the titanium-containing film. An example of this is illustrated in FIG. 2E where a layer of platinum is electrolessly deposited on the titanium nitride layer 230, where the zinc layer 240 has served as an activation layer for the electroless deposition and is consumed in the process. FIG. 2F illustrates the top down view of the substrate of FIG. 2E.

In one embodiment, platinum may be selectively plated over a titanium nitride film in semiconductor processing as part of the building of a memory device. In this embodiment the zinc passivation layer is formed on a titanium nitride layer by electroless deposition where the zinc passivation layer also acts as an activation layer. The zinc layer is therefore consumed by the electroless process to form a layer of platinum directly on the titanium nitride. In one particular embodiment, the electroless plating solution to plate the platinum film over titanium nitride may be formed of the following components in deionized water. The platinum supply chemical is pre-treated chloroplatinic acid where the concentration of platinum in the plating bath is in the approximate range of 2 mM and 30 mM. The reducing agent is hydrazine in a concentration in the approximate range of 0.1M and 1M. This hydrazine concentration in combination with the complexing agent hydroxylamine and the stabilizer additives enables continuous, self-initiated, platinum deposition operation at bath temperatures of up to 80° C. without the need of intermittent hydrazine addition. The accelerator is sulfamic acid, also known as aminosulfonic acid, in a concentration in the approximate range of 0 to 0.5M. The primary stabilizer is 5-sulfosalicylic acid in a concentration in the approximate range of 2 mM to 20 mM, and the secondary stabilizer is EDTA having a concentration in the approximate range of 1 mM to 10 mM. In this embodiment, the electroless plating solution is applied at a temperature of 20-80° C. and at a pH in the approximate range of 8 and 12. The electroless plating solution is applied to the substrate by submerging the substrate in a bath of the solution for a time of approximately 0.5 and 2.0 minutes to form a platinum layer having a thickness of 100 Å to 400 Å.

The electroless plating solution may be applied to the surface of the substrate 200 in any conventional manner to form the platinum film 250. Methods of applying the electroless plating solution include, but are not limited to, substrate immersion into a plating bath tank, and bath solution dispensation onto the substrate from a dispensing nozzle or shower head connected with a bath reservoir and flow controller. In one embodiment the electroless plating solution is a bath and the substrate is submerged for a particular amount of time. The electroless plating bath solution may have a temperature in the range of 20° C. to 85° C. and a pH in the range of 8 to 12. The plating solution may be applied to the substrate for an amount of time in the range of approximately 30 seconds to 5 minutes, although this can vary depending on how thick of a platinum film is required. The amount of time that the substrate is exposed to the plating solution depends on the thickness desired for the platinum film being formed on the copper film. The choice of thickness of the platinum film depends on the particular application. The platinum film may be a passivation layer over titanium or titanium-containing layers in various semiconductor based devices in both memory and logic applications. For an electrode application for memory chips the thickness of the platinum film may be 50-200 Å. A selectively formed platinum film is valuable as a passivation layer atop a bottom electrode for certain memory devices. For example, the memory device may be a metal-insulator-metal (MIM) structure.

The process outlined in the flowchart of FIG. 1 may be followed through in any number of different ways. In one exemplary embodiment, the method may be a single zincation process having the following recipe:
 a) Oxide etching to remove the oxide layer from a titanium nitride layer using an acidic etching solution having a temperature of approximately 80 C and is applied to the substrate for approximately 5-7 minutes;
 b) Applying an IPA rinse at room temperature for approximately 15 seconds;
 c) Applying a zincating solution at room temperature for a time in the approximate range of 20 seconds to 5 minutes to form a zinc passivation layer selectively on the titanium nitride layer;
 d) Rinsing the substrate with a deionized water rinse at room temperature for approximately 30 seconds;
 e) Depositing a platinum layer selectively on the titanium-containing layer using electroless deposition;
 f) Rinsing the substrate with deionized water and drying the substrate.

In another embodiment, the method may use a double zincating process as follows:
 a) Oxide etching to remove the oxide layer from the titanium-containing layer using an acidic etching solution at 80 C for approximately 2 minutes;
 b) Applying an IPA rinse to the substrate at room temperature for approximately 15 seconds;

c) Applying a zincating formulation to the substrate at room temperature for a time in the approximate range of 20 seconds to 1 minute;
d) Applying an acidic etching solution at 80 C to the substrate for approximately 2 minutes;
e) Rinsing the substrate with the IPA rinse at room temperature for 15 seconds;
f) Applying the zincating formulation to the substrate at room temperature for approximately 20 seconds;
g) Applying a deionized water rinse to the substrate at room temperature for 30 seconds;
h) Depositing a platinum layer on the titanium-containing layer using electroless deposition; and
i) Rinsing the substrate with deionized water and drying the substrate.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method, comprising:
providing a semiconductor substrate comprising a titanium nitride layer;
etching an oxide from the titanium nitride layer;
rinsing the substrate with isopropyl alcohol; and
applying a zincating formulation to the substrate, the zincating formulation comprising a zinc salt, $FeCl_3$, and a pH adjuster to form a zinc passivation layer on the titanium nitride layer, wherein the pH adjuster comprises an acid.

2. The method of claim 1, further comprising selectively forming a platinum layer on the titanium nitride layer by an electroless plating process, where the zinc passivation layer acts as an activation layer for the electroless plating process.

3. The method of claim 1, further comprising annealing the zinc passivation layer after forming the zinc passivation layer.

4. The method of claim 1, wherein etching the oxide does not include applying hydrogen fluoride.

* * * * *